(12) United States Patent
Matsuo et al.

(10) Patent No.: US 6,617,613 B2
(45) Date of Patent: Sep. 9, 2003

(54) ARRAY OF LIGHT EMITTING DEVICES WITH EXTENDED LIFETIME AND HIGH LUMINESCENCE

(75) Inventors: Mikiko Matsuo, Nara (JP); Tetsuya Satou, Kadoma (JP); Hisanori Sugiura, Hirakata (JP); Naohide Wakita, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/092,160

(22) Filed: Mar. 5, 2002

(65) Prior Publication Data

US 2002/0139985 A1 Oct. 3, 2002

(30) Foreign Application Priority Data

Mar. 7, 2001 (JP) ........................................ 2001-063058

(51) Int. Cl.[7] .............................................. H01L 33/00
(52) U.S. Cl. .............................. 257/79; 257/79; 257/88
(58) Field of Search ............................ 257/75, 88, 89; 362/294; 437/127; 313/501, 504; 428/690; 438/99

(56) References Cited

U.S. PATENT DOCUMENTS

| | | | | |
|---|---|---|---|---|
| 5,427,977 A | * | 6/1995 | Yamada et al. ............. | 437/127 |
| 5,583,350 A | * | 12/1996 | Norman et al. ............. | 257/88 |
| 5,857,767 A | * | 1/1999 | Hochstein ................... | 362/294 |
| 5,869,929 A | * | 2/1999 | Eida et al. .................. | 313/501 |
| 6,054,724 A | * | 4/2000 | Ogihara et al. .............. | 257/88 |
| 6,333,521 B1 | * | 12/2001 | Thompson et al. .......... | 257/79 |
| 6,361,885 B1 | * | 3/2002 | Chou .......................... | 428/690 |
| 6,375,340 B1 | * | 4/2002 | Biebl et al. ................. | 362/294 |
| 2002/0079503 A1 | * | 6/2002 | Yamazaki et al. ........... | 257/89 |

OTHER PUBLICATIONS

"Organic electroluminescent diodes" by C.W. Tang et al., Applied Physics Letters, vol. 51, No. 12, pp. 913–915, Sep. 21, 1987.

Spring 2000; The Japan Society of Applied Physics Annual Meeting (31a–H–3).

* cited by examiner

Primary Examiner—Hoai Ho
Assistant Examiner—Thinh T. Nguyen
(74) Attorney, Agent, or Firm—Merchant & Gould, P.C.

(57) ABSTRACT

A light-emitting device includes a plurality of light-emitting elements provided on a base material, each of the light-emitting elements including a pair of electrodes, and a light-emitting layer interposed between the electrodes. Light-emitting surfaces of the light-emitting elements are arranged along a standing direction with respect to the base material. The light-emitting elements are formed into a belt shape, a strap shape, a cylindrical shape or a columnar shape or formed to be porous, thereby increasing a surface area of the light-emitting element drastically so as to reduce a current amount per unit area, thus providing a light source with an extended lifetime even in a high luminance application.

27 Claims, 3 Drawing Sheets

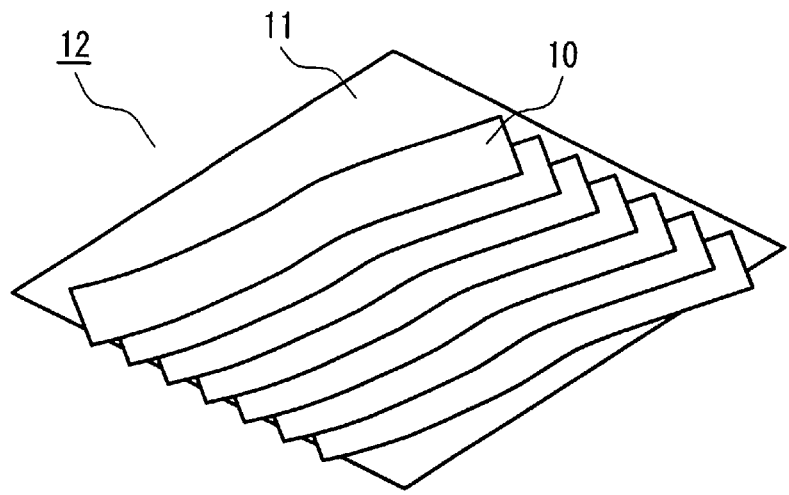
F I G. 1
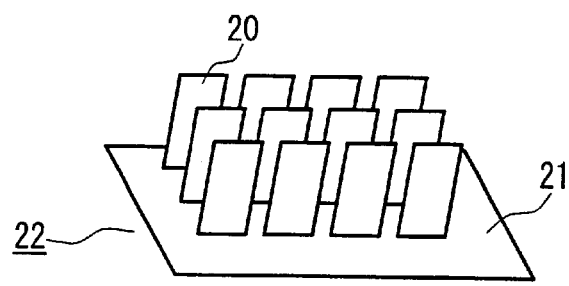
F I G. 2
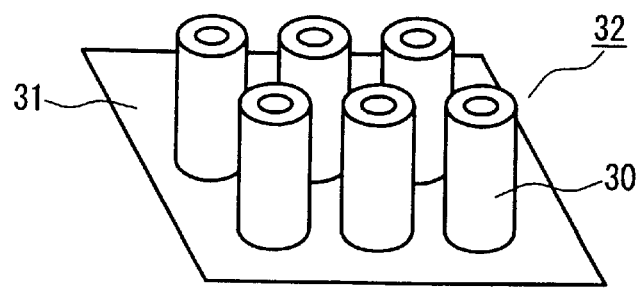
F I G. 3

ARRAY OF LIGHT EMITTING DEVICES WITH EXTENDED LIFETIME AND HIGH LUMINESCENCE

BACKGROUND OF THE INVENTION

1. Field of the Invention

The present invention relates to a light-emitting device used for a backlight for a liquid crystal display or the like, a luminaire for room lighting, or a display in a television or the like.

2. Description of Related Art

In recent years, there have been many reports on organic light-emitting elements using organic materials as light-emitting materials, for example, in Applied Physics Letters, Vol. 51, page 913, 1987. The organic light-emitting elements are characterized by planar light emission, and the ones having a high efficiency of more than 40 lm/W have just begun to be reported recently, for example, in 2000 Spring the Japan Society of Applied Physics annual meeting (31a-H-3). These studies have raised expectations for new luminaires and displays using planar light-emitting bodies.

Conventional light sources include spherical bulbs using a filament and rod-shaped lamps utilizing a discharge phenomenon. Accordingly, when being used as a luminaire, they can be categorized into direct illumination and indirect illumination. In the direct illumination, a reflecting hood for reflecting light emitted upward and sending it downward is provided, while in the indirect illumination, a reflecting plate for diffusing light or reducing glare is provided. On the other hand, electroluminescence panels (EL panels) are characterized by planar light emission. They are expected to develop as a new luminaire and be applied as a light source for display.

The EL panels can be classified mainly into inorganic EL elements and organic EL elements. The organic EL elements have an advantage in that they can be driven at lower voltage than the inorganic EL elements and emit light more efficiently. Furthermore, since they are as efficient as light-emitting diodes (LEDs) and easy to produce, their use as a future light source is expected.

However, the organic EL elements have a problem of short lifetime in a high-luminance application. The reason is that, since their efficiency is lower than fluorescent lamps emitting light at least at a high efficiency of 80 lm/W, the organic EL elements have to be used under heavier load conditions in the high-luminance application.

Thus, there has been a problem that the organic EL elements with the conventional planar structure cannot achieve a sufficiently long lifetime as a light source usable in the high-luminance application.

On the other hand, in order to increase the luminous flux obtained from a light-emitting surface of the organic EL element, a surface area thereof can be increased. An increase in the surface area of the organic EL elements can improve a leading-out efficiency of light. There are various methods for increasing the surface area. For example, a surface of a substrate 71 is formed to be rough as in a light-emitting element 70 shown in FIG. 7, or an anode 72 is patterned to be rough. Subsequently, a light-emitting layer 73 and a cathode 74 further are formed thereon. Alternatively, as shown in FIG. 8, planar or rough light-emitting elements 81, 82 and 83 are laminated so as to form a layered light-emitting element 80.

However, these conventional methods pose a problem in that the surface area of the organic EL elements is, at most, about two to three times as large as the conventional elements and cannot be increased drastically.

SUMMARY OF THE INVENTION

It is an object of the present invention to solve the conventional problems described above and to provide a light source with an extended lifetime even in a high luminance application by increasing a surface area of a light-emitting element drastically so as to reduce a current amount per unit area.

In order to achieve the above-mentioned object, a light-emitting device of the present invention includes a plurality of light-emitting elements provided on a base material. Each of the light-emitting elements includes a pair of electrodes, and a light-emitting layer interposed between the electrodes. Light-emitting surfaces of the light-emitting elements are arranged along a standing direction with respect to the base material.

In the light-emitting device of the present invention, the light-emitting elements can be formed into a belt shape.

In the light-emitting device of the present invention, the light-emitting elements can be formed into a strap shape.

Also, in the light-emitting device of the present invention, the light-emitting elements can be formed into a cylindrical shape or a columnar shape.

Furthermore, in the light-emitting device of the present invention, the light-emitting elements can be formed to be porous.

Moreover, the light-emitting device of the present invention can use a layered light-emitting element formed by laminating a plurality of light-emitting elements, each comprising a pair of electrodes and a light-emitting layer interposed between the electrodes.

In the light-emitting device of the present invention, the light-emitting layer of the light-emitting elements may be formed of an organic material.

Alternatively, in the light-emitting device of the present invention, the light-emitting layer of the light-emitting elements may include a plurality of organic materials having different emission colors.

In the light-emitting device of the present invention, the organic material may be dispersed.

Alternatively, in the light-emitting device of the present invention, the organic materials may be isolated according to their emission colors.

In the light-emitting device of the present invention, the light-emitting layer of the light-emitting elements may include a plurality of layers, each being a layer formed of an organic material having an emission color different from each other.

In the light-emitting device of the present invention, a hole transport layer may be laminated on the light-emitting layer of the light-emitting elements.

Furthermore, in the light-emitting device of the present invention, an electron transport layer may be laminated on the light-emitting layer of the light-emitting elements.

In addition, a light-emitting device of the present invention includes a layered light-emitting element formed by laminating 10 to 500 light-emitting elements, each including a pair of electrodes, and a light-emitting layer interposed between the electrodes.

BRIEF DESCRIPTION OF THE DRAWINGS

FIG. 1 is an external view showing a light-emitting device of the present invention using belt-like light-emitting elements.

FIG. 2 is an external view showing a light-emitting device of the present invention using strap-like light-emitting elements.

FIG. 3 is an external view showing a light-emitting device of the present invention using cylindrical light-emitting elements.

DESCRIPTION OF THE PREFERRED EMBODIMENTS

The following is a description of embodiments of the present invention.

A light-emitting device of the present invention includes a plurality of light-emitting elements provided on a base material, each of the light-emitting elements including a pair of electrodes and a light-emitting layer interposed between the electrodes, in which light-emitting surfaces of the light-emitting elements are arranged along a standing direction with respect to the base material. This can increase a surface area of the light-emitting element drastically, thereby improving illuminance. The above-mentioned standing direction of the light-emitting surfaces of the light-emitting elements can be a direction forming an angle of about 50 to 90° with respect to the base material surface.

More specifically, the light-emitting element may be formed into a belt shape, a strap shape, a cylindrical shape or a columnar shape or formed to be porous, for example, and a plurality of the light-emitting elements may be provided so that the light-emitting surfaces thereof are arranged along the standing direction with respect to the base material. Furthermore, the belt-like light-emitting elements may be wound up or overlapped so as to form an overlapping structure and then provided on the base material. Moreover, by forming a reflecting material in a portion in the base material where the light-emitting elements are provided, it is possible to improve illuminance further.

Figure 9:
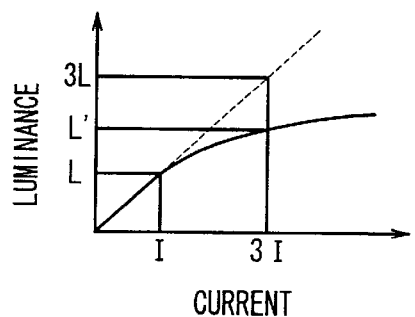
FIG. 9 is a graph showing current-luminance characteristics of a light-emitting element.

On the other hand, an expansion of the surface area of the light-emitting element causes an increase in current required for lighting. Therefore, the light-emitting element with a planar structure requires a large amount of current in a high luminance application. In general, the current-luminance characteristics of a light-emitting element, which are shown in FIG. 9, indicate that, in a high luminance region, a threefold increase in current consumption is accompanied by luminance loss of 3L-L'. However, since the surface area of the light-emitting surface can be increased drastically in accordance with the present invention, it is possible to increase luminous flux and reduce a current amount per unit area of the light-emitting element. Now, the graph of FIG. 9 is converted into a graph of luminance and luminance change rate with respect to current, namely, a graph of luminance and current efficiency, which is shown in FIG. 10.

Figure 10:
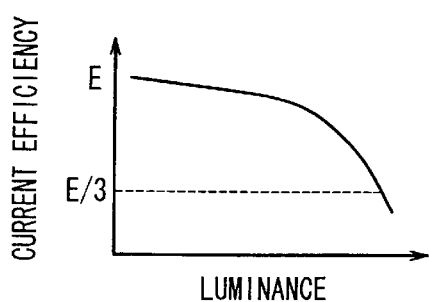
FIG. 10 is a graph showing luminance-current efficiency characteristics of the light-emitting element.

As shown in FIG. 10, there is a notable decrease in the current efficiency during high-luminance light emission. This indicates that, by increasing the surface area of the light-emitting element to be activated to output light in a low luminance region with a high luminance change rate with respect to current, it is possible to achieve higher luminous efficiency and higher illuminance in the light-emitting element. When it comes to driving current, this means driving the light-emitting element with a current value lower than a maximum current value that can be supplied to this light-emitting element. More specifically, it is desirable that the driving current value is not greater than substantially 50% of the maximum current value, and it is further desirable that it is not greater than 40% or 30% thereof. As described above, the light-emitting device of the present invention can achieve high illuminance even with low luminance and low current consumption.

The maximum current value may be regarded as a current value in a voltage region with respect to current-voltage characteristics of the light-emitting device, where an increase in voltage does not raise current any more. The graph of light-emitting characteristics shown in FIG. 10 is just an example, but current efficiency generally reaches its maximum value when luminance becomes approximately zero. The maximum value of the luminance change rate with respect to current described in the present embodiment refers to current efficiency at 1 cd/m$^2$, and in a low luminance region of at least ⅓ of this value, the light-emitting element is activated to output light. In addition, although the lifetime of a light-emitting element generally is inversely proportional to luminance, utilizing the low luminance region also can produce a life-extending effect of the light-emitting element.

The light-emitting element used in the present invention can be a regular light-emitting element having a general structure. Thus, not only a structure of anode/hole transport layer/light-emitting layer/electron transport layer/cathode (DH structure), but also those of anode/hole transport layer/light-emitting layer/cathode (SH-A structure), anode/light-emitting layer/electron transport layer/cathode (SH-B structure), and anode/light-emitting layer/cathode (single layer structure) may be used. Furthermore, a plurality of the light-emitting elements may be laminated so as to form one layered light-emitting element.

The substrate used in the above-described light-emitting element can be any substrate as long as it can support layered thin films with the basic structures described above, any of which is laminated on the substrate. When leading out light from the side opposing the substrate, there is no particular limitation on the material and form of the substrate. When leading out light from the side of the substrate, the substrate may be made of any transparent or semi-transparent material so that light emitted from each of the above-described layers can be led out. Thus, glass such as Corning 1737, or polyester or other resin films can be used.

At least one of the electrodes of the light-emitting element is made transparent or semi-transparent, thus making it possible to lead out planar light emission. Usually, an ITO (indium-tin-oxide) film is used for an anode as a hole injection electrode. Otherwise, tin oxide, Ni, Au, Pt or Pd may be used as the anode. In order to improve transparency or reduce resistivity, the ITO film is formed by sputtering, electron-beam evaporation or ion plating. The film thickness is determined according to a required sheet resistance and visible light transmittance. However, since the driving current density is relatively high in the light-emitting element, the thickness often is at least 100 nm in order to reduce the sheet resistance. For the cathode as an electron injection electrode, an alloy of a metal having a low work function and a low electron injection barrier and a stable metal having a relatively high work function, such as an MgAg alloy or an AlLi alloy suggested by Tang et al., often is used. Also, a metal having a low work function is formed on the side of an organic layer, and a thick metal having a high work function is laminated thereon for the purpose of protecting this low work function metal. A layered electrode such as Li/Al or LiF/Al can be used. In the case of the layered light-emitting element described above, both the electrodes have to be transparent or semi-transparent. In this case, not only the ITO film described above, but also tin oxide, Ni, Au, Pt, Pd, MgAg alloy and AgPdCu alloy thin films can be used for the cathode. When the light-emitting material is an organic material, the organic layer might be damaged, which preferably is prevented by providing phthalocyanines such as dilithium phthalocyanine or a mixed layer of a pyrazabole derivative and an alkali metal. It is preferable that these cathodes are formed by vapor deposition or sputtering.

The material for the hole transport layer preferably is a derivative having triphenylamine as a basic skeleton. For example, a tetraphenylbenzidine compound, a triphenylamine trimer, a triphenylamine tetramer or a benzidine dimer can be used. Also, a triphenyldiamine derivative or a MTPD (N,N'-diphenyl-N,N'-bis(3-methylphenyl)-1,1'-biphenyl-4,4'-diamine) may be used. In particular, the triphenylamine tetramer is preferable.

The material for the electron transport layer preferably is tris(8-quinolinolato) aluminum (in the following, referred to as Alq). Other examples include 3-(2'-benzothiazolyl)-7-diethylaminocoumarin and a metal complex such as tris(4-methyl-8-quinolinolato) aluminum. The thickness of the electron transport layer preferably is 10 to 1000 nm.

The material for the light-emitting layer used in the present invention can be not only the above-mentioned Alq and derivatives thereof, but also a low molecular weight material such as 4,4'-bis(2,2-diphenylvinyl) biphenyl or tetraphenylporphin and a high molecular weight material such as poly(p-phenylenevinylene) or polyfluorene. Furthermore, in order to improve the luminous efficiency and change an emission color, the light-emitting layer may be doped with a light-emitting material such as a laser dye, or a phosphorescent heavy metal complex such as tris(2-phenylpyridine) iridium or 2,3,7,8,12,13,17,18-octaethylporphyrinplatinum (II) may be used. Incidentally, the hole transport material and the electron transport material described above may be present in a mixed form so as to improve a hole transport capacity and an electron transport capacity. Moreover, an inorganic phosphor or the like may be used and can be applied by dispersing it in a high molecular weight matrix. The light-emitting layer may be formed of only a single material emitting red, blue, green or yellow, or a plurality of materials can be contained in one layer so as to extract a mixed color. In addition, as in a display apparatus such as a CRT, for example, one layer may be divided so as to isolate each emission color. Furthermore, layers separated according to each color may be laminated so that colors emitted from each of these layers are superimposed.

It is desirable that the hole transport layer, the electron transport layer and the light-emitting layer described above are formed to be amorphous and homogeneous, and it is preferable that they are formed by vacuum vapor deposition. Furthermore, by forming these layers successively in a vacuum, it is possible to prevent adhesion of impurities to interfaces between the layers, thereby improving characteristics, for example, lowering operating voltage, increasing efficiency and extending lifetime. When forming these layers by vacuum vapor deposition, in the case where a plurality of compounds are contained in one layer, although it is preferable that the temperatures of boats containing the compounds individually are controlled so as to allow co-deposition, a mixture that is prepared beforehand may be deposited. Furthermore, other film forming methods can include a solution application method and a Langmuir-Blodgett (LB) technique. In the solution application method, each compound may be dispersed in a matrix material such as a polymer.

In addition, the base material provided with the above-described light-emitting elements in the present invention can be glass, a thermoplastic resin such as an acrylic resin, vinyl chloride, polypropylene or polycarbonate, a thermosetting resin such as melamine or a phenolic resin, or a metallic material such as stainless steel.

Furthermore, by producing a light-emitting device including a layered light-emitting element formed by laminating 10 to 500 light-emitting elements, each including a pair of electrodes and a light-emitting layer interposed between the electrodes, the surface area of the light-emitting element can be increased drastically so as to reduce a current amount per unit area, thus providing a light source with an extended lifetime even in a high luminance application.

The light-emitting device of the present embodiment can create a new illuminated space by using the above-described light-emitting element with a high efficiency so as to achieve a new light source of planar light emission. Also, as a backlight such as a white light source or a single color light source, the light-emitting device of the present embodiment can be applied to a display apparatus such as a liquid crystal display. Furthermore, it can be used in a display of a television or the like.

In the following, the present invention will be described in more detail by way of specific examples.

FIRST EXAMPLE

An ITO film as a transparent anode was formed on a polycarbonate substrate 1 m in length, 1 m in width and 0.3 mm in thickness. Subsequently, poly(p-phenylenevinylene) as a light-emitting layer was applied to be 80 nm thick, Ca as an electron injection cathode was deposited to be 10 nm thick, and Al as a cathode further was deposited to be 100 nm thick, thereby producing a light-emitting film. This light-emitting film was cut into belts 5 cm in width and 30 cm in length, thereby obtaining belt-like light-emitting elements. Next, as shown in FIG. 1, the lengthwise sides of these belt-like light-emitting elements 10 were inserted and fixed into a groove-like fixture of an acrylic-resin base material 11, 30 cm in length and 25 cm in width, having a metal reflecting surface, thereby obtaining a light-emitting device 12 of the present invention. At this time, light-emitting surfaces of the belt-like light-emitting elements were arranged perpendicularly to the base material. The belt-like light-emitting elements were spaced away from each other by 5 mm, and the number of these light-emitting elements was 50.

The luminous efficiency of the present light-emitting device was 15 lm/W, which was about 1.5 times as high as the luminous efficiency of a single light-emitting element that emitted light as a planar light source. This is attributable to an effect of an end-face light emission of the light-emitting elements used in the present invention. Furthermore, the area of the region as the light source (the area of the base material) was 750 cm$^2$, while the total area of the light-emitting surfaces of the light-emitting elements was 7500 cm$^2$, which was a 10 fold areal increase. Consequently, it became possible to achieve a desired illuminance even when the luminance of each of the light-emitting elements was reduced to $\frac{1}{10}$.

Since in the organic light-emitting elements, the current efficiency (cd/A) becomes higher toward the low-luminance side, the present light-emitting device also can achieve longer lifetime. In other words, when a normal illuminance measured at a distance of 1 m was 100 lx, the lifetime of the present light-emitting device was 12000 hours, which was about 13 times as long as the case where the same illuminance was obtained by a planar light-emitting element 30 cm in length and 25 cm in width.

In such applications as partial illumination and indirect illumination, the light-emitting device can be produced to have a length and a width, each on the order of 10 cm to 1 m, as in the present example. In accordance with the present invention, a large area such as a wall surface or a ceiling surface can be covered; for example, the light-emitting device can be produced to have a length and a width, each on the order of 10 m. At this time, the longitudinal length of the belt-like light-emitting element can be designed suitably according to the lengthwise size of the base material to which it is attached. An attachment form such as wavy or curly shape allows a sufficient length to be secured. It is preferable that the widthwise length of the belt-like light-emitting element is not greater than approximately 20% of the lengthwise size of the base material.

SECOND EXAMPLE

An ITO film as a transparent anode was formed on a glass substrate 30 cm in length, 40 cm in width and 0.5 mm in thickness. Subsequently, a 50 nm thick hole transport layer formed of N,N'-bis(4'-diphenylamino-4-biphenylyl)-N,N'-diphenylbenzidine was formed, then 4,4'-bis(carbazole-9-yl)-biphenyl and tris(2-phenylpyridine) iridium at a mass ratio of 95:5 as a light-emitting layer were deposited to be 30 nm thick, (biphenyl-4-olato)bis(2-methyl-8-quinolinolato) aluminum as a blocking layer was deposited to be 10 nm thick, tris(8-quinolinolato) aluminum as an electron transport layer was deposited to be 20 nm thick, and a layered cathode formed of Li with a thickness of 1 nm and Al with a thickness of 100 nm further was formed, thereby producing a light-emitting plate. This light-emitting plate was cut into straps 0.8 cm in width and 1.2 cm in length, thereby obtaining strap-like light-emitting elements. Next, as shown in FIG. 2, the widthwise sides of these strap-like light-emitting elements 20 were inserted and fixed into a groove-like fixture of an acrylic-resin base material 21, 3 cm in length and 4 cm in width, having a metal reflecting surface, thereby obtaining a light-emitting device 22 of the present invention. At this time, light-emitting surfaces of the strap-like light-emitting elements were arranged perpendicularly to the base material. Three rows of the strap-like light-emitting elements were arranged in such a manner as to be spaced away from each other in the widthwise direction by 2 mm and on the light-emitting surface side by 10 mm, and the number of these light-emitting elements was 63.

The luminous efficiency of the present light-emitting device was 30 lm/W, which was about 1.6 times as high as the luminous efficiency of a single light-emitting element that emitted light as a planar light source. This is attributable to an effect of an end-face light emission of the light-emitting elements used in the present invention. Furthermore, the area of the region as the light source (the area of the base material) was 12 cm$^2$, while the total area of the light-emitting surfaces of the light-emitting elements was 60.5 cm$^2$, which was about a 5 fold areal increase. Consequently, it became possible to achieve a desired illuminance even when the luminance of each of the light-emitting elements was reduced to $\frac{1}{5}$.

Since in the organic light-emitting elements, the current efficiency (cd/A) becomes higher toward the low-luminance side, the present light-emitting device also can achieve longer lifetime. In other words, when a normal illuminance measured at a distance of 1 m was 100 lx, the lifetime of the present light-emitting device was 15000 hours, which was about 6 times as long as the case where the same illuminance was obtained by a planar light-emitting element 3 cm in length and 4 cm in width.

Although the present example is directed to an application to a small light-emitting light source, it also can be used for a larger illumination as in the first example. In any cases, it is preferable that the longitudinal length of the strap is not greater than approximately 20% of the lengthwise size of the base material.

THIRD EXAMPLE

An ITO film as a transparent anode was formed on a straw-like polycarbonate 2 mm in inner diameter, 50 cm in length and 0.2 mm in thickness, followed by dipping into an oligothiophene solution so as to form a light-emitting layer by dip-coating. After drying, a layered electrode formed of an MgAg alloy with a thickness of 10 nm (the mass ratio of Mg to Ag was 10:1) and ITO with a thickness of 100 nm was formed as a transparent cathode, and a 1 $\mu$m thick SiN film further was formed as a protective film, thereby producing a light-emitting tube. This light-emitting tube was cut into cylinders 1 cm in length, thereby obtaining cylindrical light-emitting elements. Next, as shown in FIG. 3, these cylindrical light-emitting elements 30 were fit and fixed onto a fixture having columnar protrusions provided in a stainless base material 31, 3 cm in length and 3 cm in width, having a metal reflecting surface, thereby obtaining a light-emitting device 32 of the present invention. Seven rows of the cylindrical light-emitting elements were arranged with 5 mm pitches, and the number of these light-emitting elements was 49.

The luminous efficiency of the present light-emitting device was 8 lm/W, which was about 1.5 times as high as the luminous efficiency of a single light-emitting element that emitted light as a planar light source. This is attributable to an effect of an end-face light emission of the light-emitting elements used in the present invention. Furthermore, the area of the region as the light source (the area of the base material) was 9 cm$^2$, while the total area of the light-emitting surfaces of the light-emitting elements was 36.9 cm$^2$, which was about a 4 fold areal increase. Consequently, it became possible to achieve desired illuminance even when the luminance of each of the light-emitting elements was reduced to $\frac{1}{4}$.

Since in the organic light-emitting elements, the current efficiency (cd/A) becomes higher toward the low-luminance side, the present light-emitting device also can achieve longer lifetime. In other words, when a normal illuminance measured at a distance of 1 m was 100 lx, the lifetime of the present light-emitting device was 8000 hours, which was about 4 times as long as the case where the same illuminance was obtained by a planar light-emitting element 3 cm in length and 3 cm in width.

Although the straw-like polycarbonate was used in the present example, a columnar polycarbonate also may be used. In addition, the material thereof also may be glass or metal. When it is metal, such a metal can be used as an electrode.

FOURTH EXAMPLE

A polycarbonate was formed into a porous substrate having 1.5 cm deep circular holes with a radius of 2 mm that are spaced away from each other by 1 mm. On a surface with holes of this porous substrate, 200 nm thick Al was deposited, and then 1 nm thick Li was deposited so as to form a cathode. Subsequently, tris(8-quinolinolato) aluminum as an electron transport layer was deposited to be 40 nm thick, (biphenyl-4-olato)bis(2-methyl-8-quinolinolato) aluminum as a blocking layer was deposited to be 10 nm thick, 4,4'-bis(carbazole-9-yl)-biphenyl and tris(2-phenylpyridine) iridium at a mass ratio of 95:5 as a light-emitting layer were deposited to be 30 nm thick, and then a 50 nm thick hole transport layer formed of N,N'-bis(4'-diphenylamino-4-biphenylyl)-N,N'-diphenylbenzidine was formed. Furthermore, an ITO film as a transparent anode was formed thereon, a 1 μm thick SiN film was formed as a protective film, and finally the holes in the porous substrate were filled with cycloolefin polymer, thereby producing a light-emitting plate having porous light-emitting elements. This light-emitting plate was cut into rectangles 6 cm in length and 6 cm in width, thereby obtaining a light-emitting device of the present invention.

The luminous efficiency of the present light-emitting device was 22 lm/W. The area of the region as the light source (the area of the porous substrate) was 36 cm$^2$, while the total area of the light-emitting surfaces of the present light-emitting device was 171.6 cm$^2$, which was about a 4.8 fold areal increase. Consequently, it became possible to achieve the desired illuminance even when the luminance was reduced to 1/5 of that in the case of using a planar substrate.

Since in the organic light-emitting elements, the current efficiency (cd/A) becomes higher toward the low-luminance side, the present light-emitting device also can produce an excellent life-extending effect. In other words, when a normal illuminance measured at a distance of 1 m was 100 lx, the lifetime of the present light-emitting device was 8500 hours, which was about 4 times as long as the case where the same illuminance was obtained by a planar light-emitting element 6 cm in length and 6 cm in width.

OTHER EXAMPLES

Figure 4:
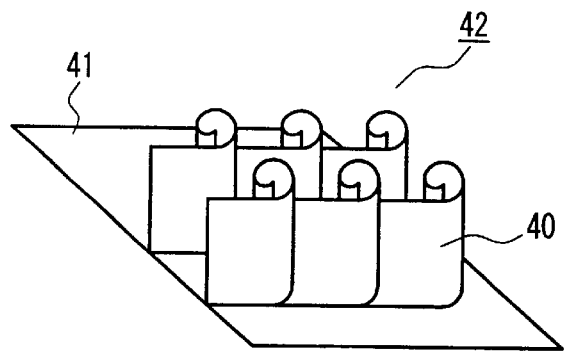
FIG. 4 is an external view showing a light-emitting device of the present invention obtained by winding the belt-like light-emitting elements so as to form an overlapping structure.

FIG. 4 shows a light-emitting device 42 of the present invention, which was obtained by winding belt-like light-emitting elements 40 produced in the first example so as to form an overlapping structure and providing the belt-like light-emitting elements 40 on a base material 41.

Figure 5:
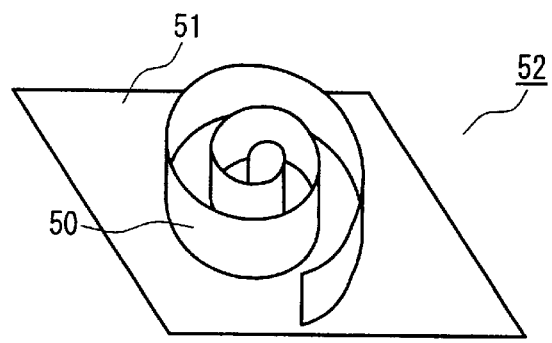
FIG. 5 is an external view showing a light-emitting device of the present invention obtained by winding the belt-like light-emitting element so as to form a large overlapping structure.

Furthermore, FIG. 5 shows a light-emitting device 52 of the present invention, which was obtained by winding a belt-like light-emitting element 50 produced in the first example so as to form a large overlapping structure and providing the belt-like light-emitting element 50 on a base material 51.

Figure 6:
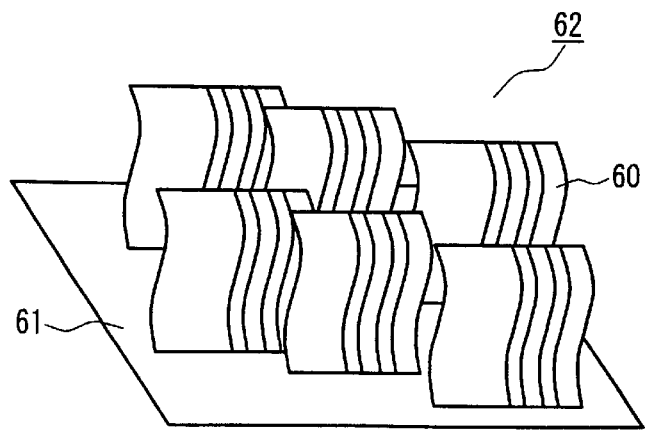
FIG. 6 is an external view showing a light-emitting device of the present invention obtained by overlapping the belt-like light-emitting elements so as to form an overlapping structure.
Figure 7:
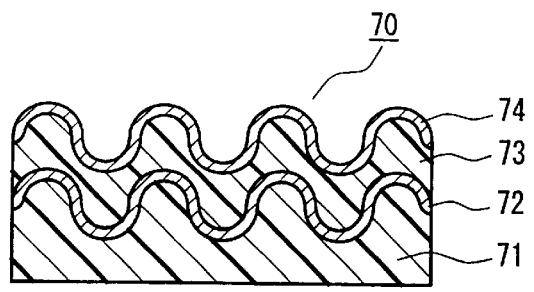
FIG. 7 is a sectional view showing a conventional light-emitting element using a rough light-emitting film.
Figure 8:
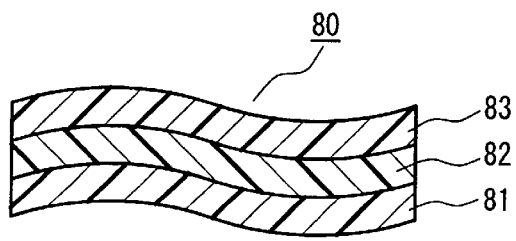
FIG. 8 is a sectional view showing a conventional layered light-emitting element.

Moreover, FIG. 6 shows a light-emitting device 62 of the present invention, which was obtained by overlapping a plurality of belt-like light-emitting elements 60 produced in the first example so as to form an overlapping structure and providing the belt-like light-emitting elements 60 on a base material 61.

As described above, the light-emitting device of the present invention includes a plurality of light-emitting elements provided on a base material, each of the light-emitting elements including a pair of electrodes and a light-emitting layer interposed between the electrodes. Light-emitting surfaces of the light-emitting elements are arranged along a standing direction with respect to the base material. This can increase a surface area of the light-emitting element so as to reduce a current amount per unit area, thereby providing a light source with an extended lifetime even in a high luminance application.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A light-emitting device comprising:
    a plurality of light-emitting elements provided on a base material, each of the light-emitting elements comprising
        a pair of electrodes, and
        a light-emitting layer interposed between the electrodes;
    wherein light-emitting surfaces of the light-emitting elements extend along a standing direction from a surface of the base material.

2. The light-emitting device according to claim 1, wherein the light-emitting elements are formed into a belt shape.

3. The light-emitting device according to claim 1, wherein the light-emitting elements are formed into a strap shape.

4. The light-emitting device according to claim 1, wherein the light-emitting elements are formed into a cylindrical shape or a columnar shape.

5. The light-emitting device according to claim 1, wherein the light-emitting elements are formed to be porous.

6. The light-emitting device according to claim 1, wherein each of the light-emitting elements is a layered light-emitting element formed by laminating a plurality of light-emitting elements, each comprising
    a pair of electrodes, and
    a light-emitting layer interposed between the electrodes.

7. The light-emitting device according to claim 1, wherein the light-emitting layer of the light-emitting elements is formed of an organic material.

8. The light-emitting device according to claim 1, wherein the light-emitting layer of the light-emitting elements comprises a plurality of organic materials having different emission colors.

9. The light-emitting device according to claim 7, wherein the organic material is dispersed.

10. The light-emitting device according to claim 8, wherein the organic materials are isolated according to their emission colors.

11. The light-emitting device according to claim 1, wherein the light-emitting layer of the light-emitting elements comprises a plurality of layers, each being a layer formed of an organic material having an emission color different from each other.

12. The light-emitting device according to claim 1, wherein a hole transport layer is laminated on the light-emitting layer of the light-emitting elements.

13. The light-emitting device according to claim 1, wherein an electron transport layer is laminated on the light-emitting layer of the light-emitting elements.

14. A light-emitting device comprising:
   a layered light-emitting element formed by laminating 10 to 500 light-emitting elements, each comprising
      a pair of electrodes, and
      a light-emitting layer interposed between the electrodes.

15. A light-emitting device comprising:
   a plurality of light-emitting elements provided on a base material, each of the light-emitting elements comprising
      a pair of electrodes, and
      a light-emitting layer interposed between the electrodes:
   wherein light-emitting surfaces of the light-emitting elements are arranged to form an angle of 5° to 90° with respect to a surface of the base material.

16. The light-emitting device according to claim 15, wherein the light-emitting elements are formed into a belt shape.

17. The light-emitting device according to claim 15, wherein the light-emitting elements are formed into a strap shape.

18. The light-emitting device according to claim 15, wherein the light-emitting elements are formed into a cylindrical shape or a columnar shape.

19. The light-emitting device according to claim 15, wherein the light-emitting elements are formed to be porous.

20. The light-emitting device according to claim 15, wherein each of the light-emitting elements is a layered light-emitting element formed by laminating a plurality of light-emitting elements, each comprising
   a pair of electrodes, and
   a light-emitting layer interposed between electrodes.

21. The light-emitting device according to claim 15, wherein the light-emitting layer of the light-emitting elements is formed of an organic material.

22. The light-emitting device according to claim 15, wherein the light-emitting layer of the light-emitting elements comprises a plurality of organic materials having different emission colors.

23. The light-emitting device according to claim 22, wherein the organic material is dispersed.

24. The light-emitting device according to claim 23, wherein the organic materials are isolated according to their emission colors.

25. The light-emitting device according to claim 15, wherein the light-emitting layer of the light-emitting elements comprises a plurality of layers, each being a layer formed of an organic material having an emission color different from each other.

26. The light-emitting device according to claim 15, wherein a hole transport layer is laminated on the light-emitting layer of the light-emitting elements.

27. The light-emitting device according to claim 15, wherein an electron transport layer is laminated on the light-emitting layer of the light-emitting elements.

* * * * *